(12) United States Patent
Jha et al.

(10) Patent No.: US 7,982,581 B2
(45) Date of Patent: Jul. 19, 2011

(54) DIGITAL POTENTIOMETER ARCHITECTURE WITH MULTIPLE STRING ARRAYS ALLOWING FOR INDEPENDENT CALIBRATION IN RHEOSTAT MODE

(75) Inventors: Kaushal Kumar Jha, Bangalore (IN); Mrinmay Talegaonkar, Bangalore (IN); Kirubakaran Ramalingam, Palakkad (IN); Bhargav Vyas, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 346 days.

(21) Appl. No.: 12/367,243

(22) Filed: Feb. 6, 2009

(65) Prior Publication Data

US 2010/0201476 A1    Aug. 12, 2010

(51) Int. Cl.
 *H01C 10/30* (2006.01)
(52) U.S. Cl. ........ 338/118; 338/185; 338/190; 341/144; 341/154
(58) Field of Classification Search ............... 338/118, 338/185, 190, 200, 334; 341/144, 145, 153, 341/154

See application file for complete search history.

(56) References Cited

U.S. PATENT DOCUMENTS

| | | | | |
|---|---|---|---|---|
| 4,016,483 | A | * | 4/1977 | Rudin .................. 323/354 |
| 6,414,616 | B1 | * | 7/2002 | Dempsey .............. 341/144 |
| 2002/0135458 | A1 | * | 9/2002 | Drori et al. ............ 338/190 |

* cited by examiner

*Primary Examiner* — Kyung Lee
(74) *Attorney, Agent, or Firm* — Kenyon & Kenyon LLP

(57) ABSTRACT

Digital potentiometer architecture is disclosed, composing of an integrated circuit containing multiple string arrays, each having a plurality of switching devices and an array of resistors. The insertion of an additional string array between the input terminals and the wiper, allows for the disconnection of a common string array and for the independent calibration of the resistance between each input terminal and the wiper.

20 Claims, 4 Drawing Sheets

DIGITAL POTENTIOMETER ARCHITECTURE WITH MULTIPLE STRING ARRAYS ALLOWING FOR INDEPENDENT CALIBRATION IN RHEOSTAT MODE

FIELD OF THE INVENTION

The present invention relates to the architecture of a digital potentiometer which allows for independent calibration of resistances when operating in rheostat mode. The present invention further relates to the architecture of a digital potentiometer operating in rheostat mode in which multiple rheostats are created from a single digital potentiometer.

BACKGROUND INFORMATION

Potentiometers are electric devices that are used in both analog and digital circuits, most often as voltage dividers where a constant voltage output is needed at an output terminal. Potentiometers can also be used in rheostat mode, where only two terminals of the 3-terminal potentiometer are used and a variable resistor is created. Unlike traditional analog potentiometers which are adjusted mechanically, digital potentiometers can be adjusted using software serial interfaces. A digital potentiometer presents advantages over an analog potentiometer because of its higher resolution, its ability to store more than one wiper position, and its cost-effectiveness in implementing.

A digital potentiometer has three terminals: two input terminals and a third terminal referred to as the wiper. In rheostat mode, only the wiper and one input terminal are used. The other input terminal is either shorted by directly connecting with the wiper, as shown in prior configurations in FIGS. 4 and 5, or left floating with no connection. Operating in this mode allows for the digital potentiometer to be configured as a variable resistor. Depending on which input terminal is shorted with the wiper or left floating, the value of this resistance is the sum of the resistances between input terminal A and the wiper, $R_a$, or input terminal B and the wiper, $R_b$, as shown in FIGS. 4 and 5.

A problem with current architecture for digital potentiometers is that they have a high tolerance when operating in rheostat mode. This tolerance is typically on the order of 30% and is problematic for circuit design when specific resistance values are needed. The current architecture of digital potentiometers is further restrictive because the resistance value of $R_a$, the resistance between input terminal A and the wiper, cannot be calibrated independently of $R_b$, the resistance between input terminal B and the wiper, as shown in FIGS. 4 and 5. FIG. 1 shows a previous configuration of a digital potentiometer, where the string array $S_5$ is common to the string array between terminal A and the wiper, $S_3$, and the string array between terminal B and the wiper, $S_4$. Therefore, neither $R_a$ nor $R_b$, the resulting resistances between the input terminals and the wiper when a switch within each string array is closed, can be adjusted without changing the value of the other corresponding resistance.

Despite the presence of both $R_a$ and $R_b$, only one variable resistor can be created from a digital potentiometer in rheostat mode. The present invention overcomes this limitation as well.

Furthermore, in the prior art, the number of strings present in the circuit was expressly limited to $2^n+1$ (where n is a natural number), the calculation of which is always an odd number, a reflection of the presence of only one string connected to the wiper. The present invention is able to overcome this limitation, with the number of strings present in the integrated circuit equal to $2^n$ which is reflective of the connection of two independent strings to the wiper terminal.

SUMMARY OF THE INVENTION

To address the above limitations of digital potentiometers operating in rheostat mode, the present invention provides a model for the architecture of a digital potentiometer which allows for the independent calibration of resistances when operating in such mode. This can be achieved by the insertion of an additional string array between the input terminals and the wiper, where the input terminals no longer share a common string array in their path to the wiper. By effectively reconfiguring the architecture, the tolerance of the resistance of the digital potentiometer can be decreased to approximately 1%. Further embodiments of the present invention include the creation of multiple variable resistors, or rheostats, when operating in rheostat mode. This is achieved by creating two separate and distinct wiper terminals that are no longer connected at a common node.

The architecture contains an integrated circuit, with three terminals, A, B, and W. Terminals A and B designate the input signal terminals to the digital potentiometer. A and B can contact a plurality of electrical devices, including voltage inputs and other electric devices.

Terminals A and B are connected to the wiper by a series of one or more string arrays, with the total number of string arrays equal to $2^n$, where n is a natural number. Each string includes a plurality of switches that are connected in parallel to one another. The plurality of switches in the string arrays share a common node where they are connected at their input terminal. The output terminals of the plurality of switches are connected to an array of resistors at selected tap points. The switches in the string arrays may be complementary metal-oxide-semiconductor ("CMOS") devices.

Further details and aspects of example embodiments of the present invention are described in more detail below with reference to the appended Figures.

DETAILED DESCRIPTION

The subject invention will now be described in detail for specific preferred embodiments of the invention, it being understood that these embodiments are intended only as illustrative examples and the invention is not to be limited thereto.

Figure 2:
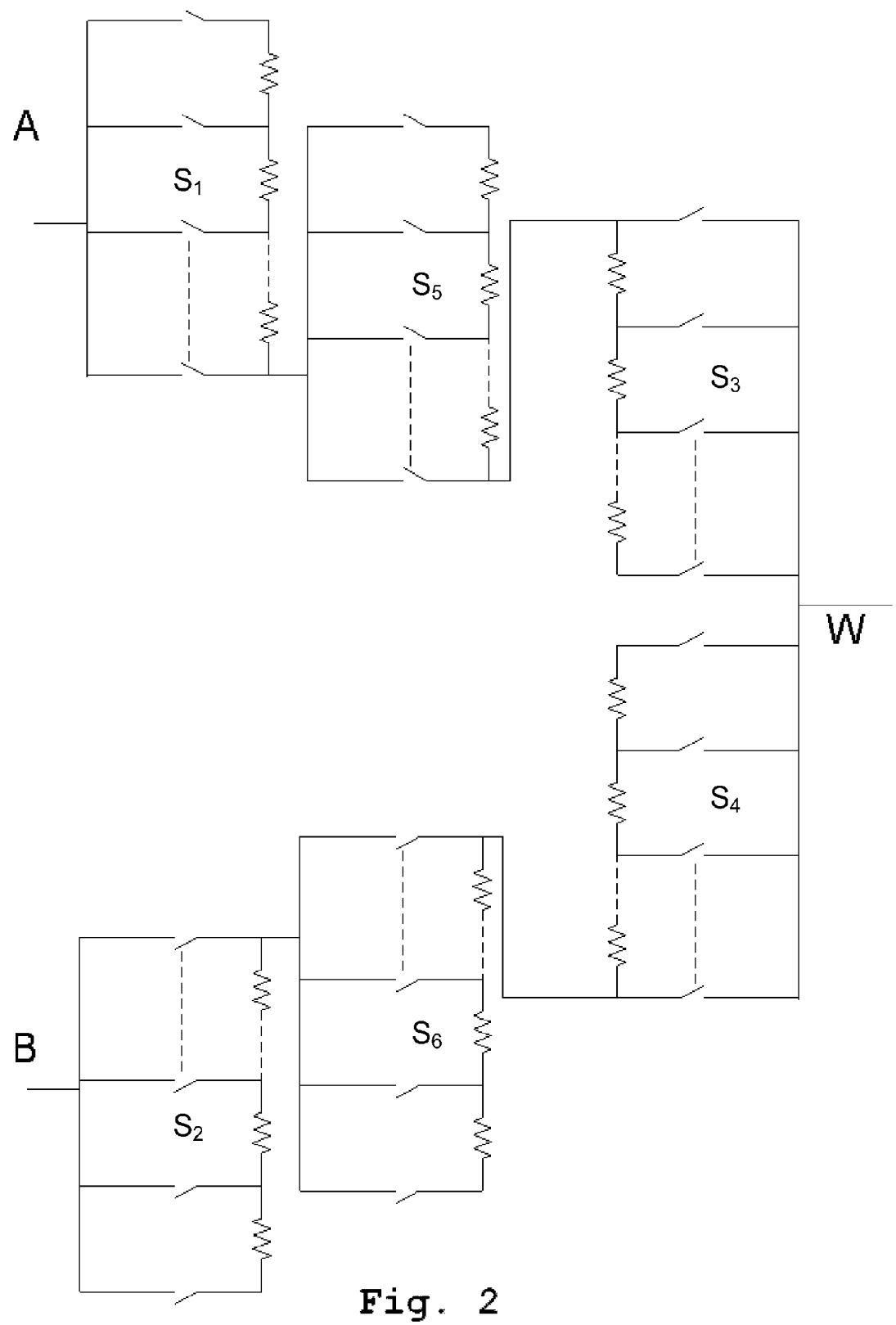
FIG. 2 is a circuit diagram of the digital potentiometer in accordance with the first embodiment of the present invention, operating in rheostat mode.
Figure 4:
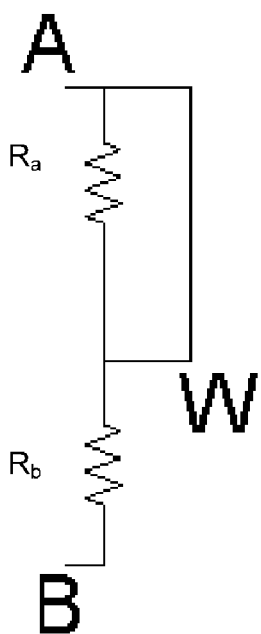
FIG. 4 is a circuit diagram of the functional equivalent of a previously configured digital potentiometer operating in rheostat mode, with the wiper terminal shorted with terminal A.
Figure 5:
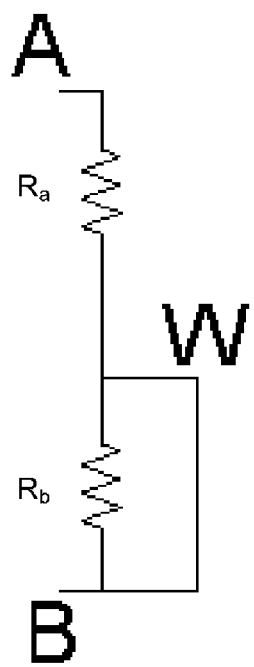
FIG. 5 is a circuit diagram of the functional equivalent of a previously configured digital potentiometer operating in rheostat mode, with the wiper terminal shorted with terminal B.

FIG. 2 shows an embodiment of the present invention for the independent calibration of resistances between both input terminals and the wiper terminal. The integrated circuit has three terminals, A, B, and W. The input terminals A and B can be connected to other electric circuit devices. Terminal W is the wiper terminal of the potentiometer, and is also connected to other electric circuit devices. In previous circuit configurations of a digital potentiometer, one of the inputs can be shorted to W as shown in FIGS. 4 and 5, or one of the inputs can be left floating.

Figure 3:
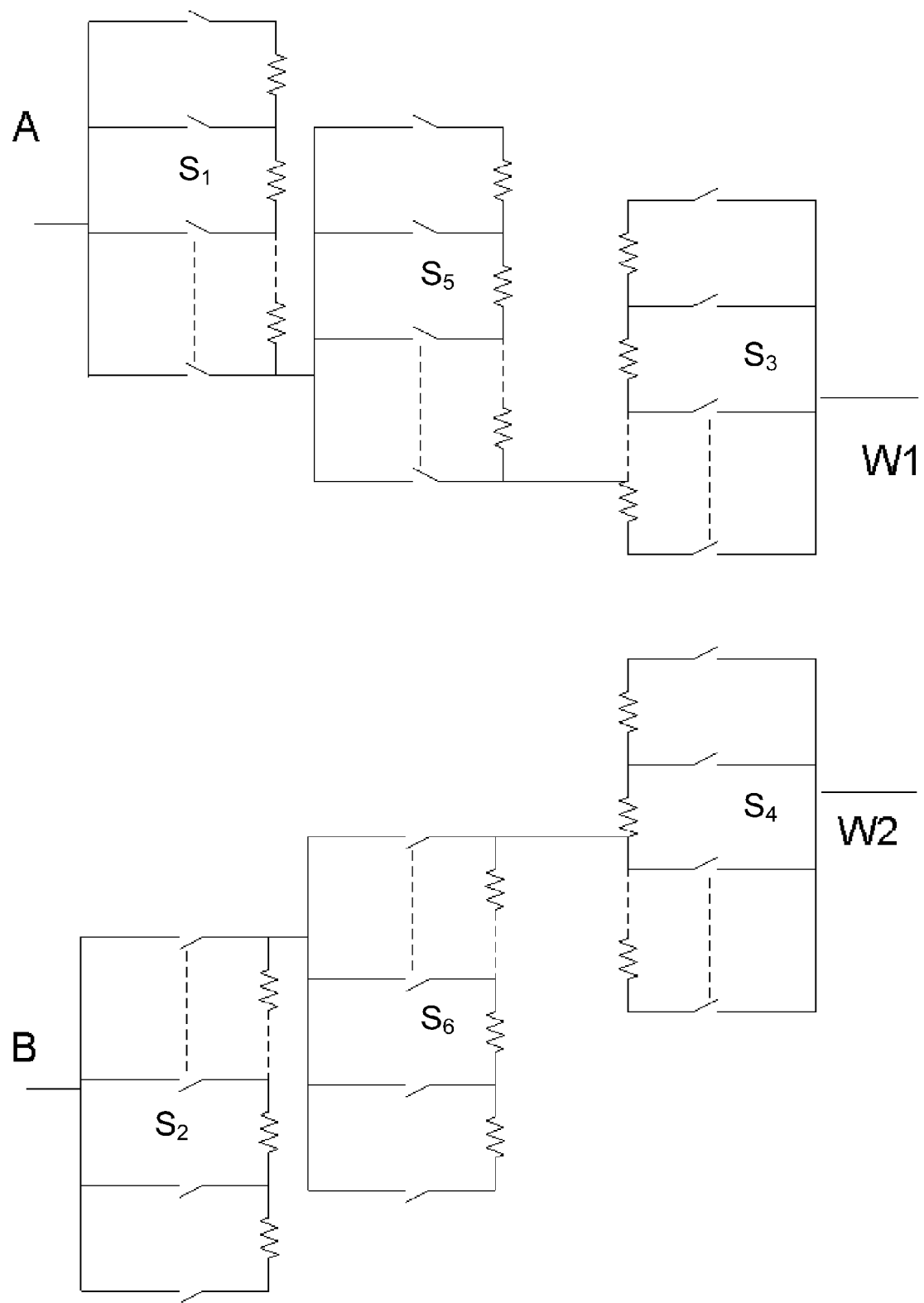
FIG. 3 is a circuit diagram of the digital potentiometer in accordance with the second embodiment of the present invention, wherein two distinct rheostats are created.

FIGS. 2 and 3 show terminals A and B connected to the wiper by a series of string arrays. FIGS. 2 and 3 also show that each string contains a plurality of switches whose output terminals are connected to an array of resistors. The plurality of switches are also in parallel with one another. The switches are preferably complementary metal-oxide-semiconductor (CMOS) devices. A CMOS is preferable over another switch such as a NMOS because of a CMOS' large dynamic range.

FIGS. 2 and 3 show the plurality of switches in the string arrays sharing a common node where they are connected to either terminal A or B at the switches' input terminals. The output terminals of the plurality of switches are connected to an array of resistors at selected tap points as shown in FIGS. 2 and 3. For a detailed description of the relationship between tap points to switch devices, please refer to U.S. Pat. No. 6,885,328 ("Kao et al."), which is incorporated by reference herein.

Although FIGS. 2 and 3 represent embodiments of the present invention, the switches devices are not limited to only connecting to the resistor arrays at the output terminals of the switches. In alternative embodiments, the plurality of switches can be connected to the resistor arrays at the input terminals of the switches, as shown in $S_3$ and $S_4$ in FIG. 2.

The resistors are connected in series in each array. The plurality of switches control the number of resistors that are connected to the wiper terminal at any time. Depending on which tap point is selected, a switch connected to that tap point will move to a closed state. The closure of the switch will connect an input terminal directly to the tap point and the amount of resistance between the input terminal and the wiper will change to the sum of the resistances between the tap point and the wiper terminal.

The resistors are chosen at intervals that allow for a selectable range of resistances. The value of each individual resistor in each array of resistors depends on the total resistance selected for each resistor array and the number of tap points. The value of the total resistance of the resistor arrays will be chosen to be higher for the resistor arrays closest to the input terminals; this corresponds to the array of resistors in strings $S_1$ and $S_2$, in FIGS. 2 and 3. The total resistance of a resistor array will subsequently decrease based upon the array's distance from an input terminal. A typical example would be if the total value of the resistance of the resistor arrays in $S_1$ and $S_2$, was chosen to be 100 k-ohms, a common selection for resistance in an electric circuit where low current is desired. The total resistance of the resistor arrays in additional string arrays $S_5$ and $S_6$ could accordingly be selected to be 10 k-ohms each and the total resistance of the resistor arrays in string arrays $S_3$ and $S_4$ could be selected to be 1 k-ohm each. This implementation is just one embodiment of the present invention, and thus the present invention should not be limited to this implementation. In an alternative embodiment, resistance values may be increased based on proximity to the wiper terminal. For further description of the selection of resistance values and the internal structure of the resistor arrays, please refer to U.S. Pat. No. 6,885,328 ("Kao et al."), which is incorporated by reference herein.

The selection of the total value of the resistance of the resistor arrays will vary depending on various factors including the desired voltage drop across the digital potentiometer or the desired current running through. Based upon the selection of the total resistance of each resistor array, the value of each individual resistor follows the formula: $R_I=R_T/n$, where $R_I$ is the value of an individual resistor in a resistor array, $R_T$ is the total resistance of a given array of resistors, and n is the number of tap points selected.

In an example where $R_T$ was chosen to be 100 k-ohms for the resistor arrays in $S_1$ and $S_2$ and the number of tap points selected was 256, the value of each individual resistor in strings $S_1$ and $S_2$ would be 390 ohms. Similarly if $R_T$ was chosen to be 10 k-ohms for the resistor arrays in $S_5$ and $S_6$, the value of each individual resistor in these strings would be 39 ohms. A selection of 1 k-ohm for $R_T$ for the resistor arrays in $S_3$ and $S_4$ would, with 256 tap points, yields individual resistor values of 3.9 ohms. This implementation is just one embodiment of the present invention, and thus the present invention should not be limited to this implementation. In an alternative embodiment, resistance values may be increased based on proximity to the wiper terminal. For further description of the selection of resistance values, the selection of the number of tap points, and the internal structure of the resistor arrays, please refer to U.S. Pat. No. 6,885,328 ("Kao et al."), which is incorporated by reference herein.

FIGS. 2 and 3 show the end of the resistor arrays in strings $S_1$ and $S_2$ connected to additional string arrays, $S_5$ and $S_6$. These additional string arrays are functionally equivalent to the first set of string arrays, $S_1$ and $S_2$. Moreover, it should be noted that any number of additional string arrays may be connected between the input terminals and the wiper terminal. These additional string arrays should be connected such that the plurality of switches share a common node at their input terminals, they are connected in parallel, and their output terminals are connected to an array of resistors at selected tap points. An example of this occurs in FIGS. 2 and 3, where there are three string arrays connected in series between each input terminal and the wiper.

While FIGS. 2 and 3 depict embodiments of the integrated circuit with six strings, the actual number of string arrays in a particular embodiment of the present invention is $2^n$, where n is a natural number. This is an improvement over the prior art which restricted the number of strings to be $2^n+1$, which is reflective of the limitation of the prior art where each input terminal shared a common string which connected to the wiper terminal.

FIGS. 2 and 3 show the output of the additional string arrays $S_5$ and $S_6$ connected to an array of resistors in strings $S_3$ and $S_4$. In embodiments of the present invention, strings $S_3$ and $S_4$ differ from the other string arrays in the integrated circuit, because the array of resistors in these strings are connected at selected tap points to the input terminals of the plurality of switches, rather than the output terminals of the switches as connected in $S_1$, $S_2$, $S_5$ and $S_6$, shown in FIGS. 2 and 3. The switches implemented in strings $S_3$ and $S_4$ are also preferably CMOS switches because of the low power consumption and fast switching benefits that they present. The CMOS switches in $S_3$ and $S_4$ will also operate in such a manner that only one switch is in a closed state at a time, and switching from one tap point to another will also change the resistance between an input terminal, A or B, and the wiper terminal.

Figure 1:
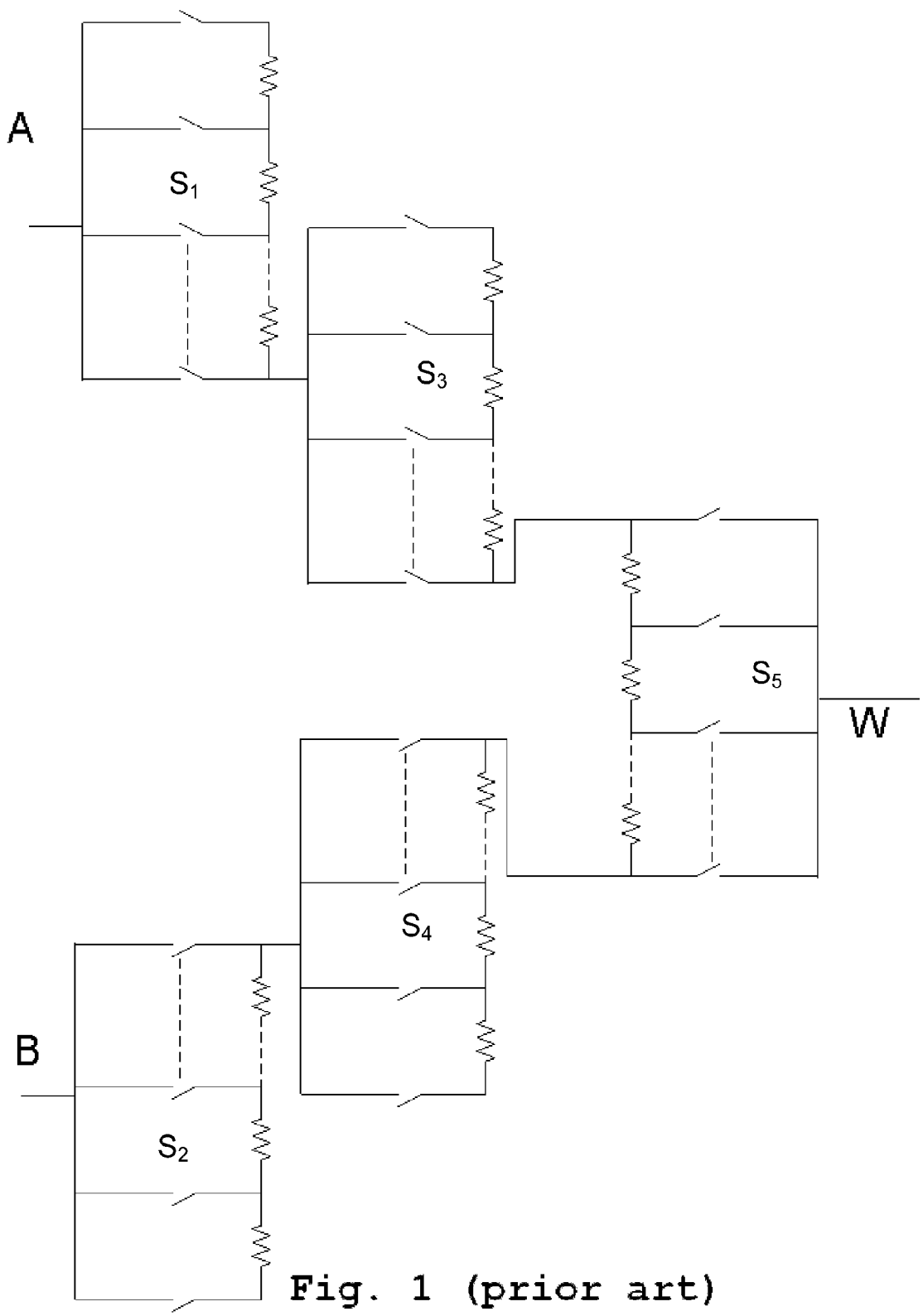
FIG. 1 is a circuit diagram of the architecture of a previously configured digital potentiometer.

In FIG. 2, the output terminals of the plurality of the switches in string arrays $S_3$ and $S_4$ terminate at the wiper terminal. Unlike the previous configuration in FIG. 1, in the present invention $S_3$ and $S_4$ are only connected at the output of the plurality of switches which terminate at the wiper. The addition of the second string array, $S_4$, connected directly to the wiper terminal, allows for the resistance between A and W to be calibrated independently of the resistance between B and W. The presence of a single common string array in the previous configuration, as shown in FIG. 1, required that any adjustment to the resistance between terminal A and W simultaneously change the resistance between terminal B and W. The present invention eliminates this limitation.

FIG. 3 depicts similar architecture to that of FIG. 2, but in this embodiment of the present invention the outputs of $S_3$ and $S_4$ are not connected together. Here, $S_3$ and $S_4$ are completely disconnected and two distinct wiper terminals are created, where $S_3$ terminates at $W_1$, the first wiper, and $S_4$ terminates at $W_2$, the second wiper. The result of this configuration is that there are two separate and distinct variable resistors, or rheostats, that can be calibrated and accessed independently. Moreover, in creating two separate and distinct rheostats, it is not necessary to increase the area of the integrated circuit. Such a result is desirable as it promotes simplicity and efficiency within the integrated circuit.

What is claimed is:

1. An integrated circuit, comprising:
   first and second input terminals;
   a wiper terminal;
   a first array of resistors connected in series, the first array of resistors having an output;
   a plurality of first switching devices connecting the first input terminal to selected tap points of the first array of resistors;
   a second array of resistors connected in series, the second array of resistors having an output;
   a plurality of second switching devices connecting the second input terminal to selected tap points of the second array of resistors;
   a third array of resistors connected in series, the third array being connected in series with the first array of resistors, the third array of resistors having an input and output;
   a plurality of third switching devices connecting selected tap points of the third array of resistors to the wiper terminal;
   a fourth array of resistors connected in series, the fourth array being connected in series with the second array of resistors, the fourth array of resistors having an input and output;
   a plurality of fourth switching devices connecting selected tap points of the fourth array of resistors to the wiper terminal;
   wherein the third array of resistors is connected to the fourth array of resistors only at the outputs of the third and fourth arrays of resistors, the outputs of the third and fourth arrays of resistors being connected to the wiper terminal.

2. The integrated circuit according to claim 1, wherein a fifth array of resistors is connected in series with the first array of resistors and the third array of resistors, the fifth array of resistors having an input and output.

3. The integrated circuit according to claim 1, wherein a sixth array of resistors is connected in series with the second array of resistors and the fourth array of resistors, the sixth array of resistors having an input and output.

4. The integrated circuit according to claim 2, wherein the input of the fifth array of resistors connects to the output of the first array of resistors, the output of the fifth array of resistors connects to the input of the third array of resistors.

5. The integrated circuit according to claim 3, wherein the input of the sixth array of resistors connects to the output of the second array of resistors, the output of the sixth array of resistors connects to the input of the fourth array of resistors.

6. The integrated circuit according to claim 2, wherein a plurality of fifth switching devices connects the output of the first array of resistors to selected tap points of the fifth array of resistors.

7. The integrated circuit according to claim 3, wherein a plurality of sixth switching devices connects the output of the second array of resistors to selected tap points of the sixth array of resistors.

8. The integrated circuit from claim 1, wherein the switching devices are complementary metal-oxide semiconductor (CMOS) devices.

9. An integrated circuit, comprising:
   first and second input terminals;
   first and second wiper terminals;
   a first array of resistors connected in series, the first array of resistors having an output;
   a plurality of first switching devices connecting the first input terminal to selected tap points of the first array of resistors;
   a second array of resistors connected in series, the second array of resistors having an output;
   a plurality of second switching devices connecting the second input terminal to selected tap points of the second array of resistors;
   a third array of resistors connected in series, the third array being connected in series with the first array of resistors, the third array of resistors having an input and output;
   a plurality of third switching devices connecting selected tap points of the third array of resistors to the first wiper terminal;
   a fourth array of resistors connected in series, the fourth array being connected in series with the second array of resistors, the fourth array of resistors having an input and output;
   a plurality of fourth switching devices connecting selected tap points of the fourth array of resistors to the second wiper terminal;
   wherein the third array of resistors is disconnected from the fourth arrays of resistors.

10. The integrated circuit according to claim 9, wherein a fifth array of resistors is connected in series with the first array of resistors and the third array of resistors, the fifth array of resistors having an input and output.

11. The integrated circuit according to claim 9, wherein a sixth array of resistors is connected in series with the second array of resistors and the fourth array of resistors, the sixth array of resistors having an input and output.

12. The integrated circuit according to claim 10, wherein the input of the fifth array of resistors connects to the output of the first array of resistors, the output of the fifth array of resistors connects to the input of the third array of resistors.

13. The integrated circuit according to claim 11, wherein the input of the sixth array of resistors connects to the output of the second array of resistors, the output of the sixth array of resistors connects to the input of the fourth array of resistors.

14. The integrated circuit according to claim 10, wherein a plurality of fifth switching devices connects the output of the first array of resistors to selected tap points of the fifth array of resistors.

15. The integrated circuit according to claim 11, wherein a plurality of sixth switching devices connects the output of the second array of resistors to selected tap points of the sixth array of resistors.

16. The integrated circuit from claim 9, wherein the switching devices are complementary metal-oxide semiconductor (CMOS) devices.

17. The integrated circuit from claim 10, wherein at least one additional array of resistors is connected in series with the fifth array of resistors and the third array of resistors.

18. The integrated circuit from claim 11, wherein at least one additional array of resistors is connected in series with the sixth array of resistors and the fourth array of resistors.

19. The integrated circuit from claim 17, wherein at least one additional plurality of switching devices connects to the at least one additional array of resistors at selected tap points.

20. The integrated circuit from claim 18, wherein at least one additional plurality of switching devices connects to the at least one additional array of resistors at selected tap points.

* * * * *